United States Patent
Yu et al.

(10) Patent No.: US 10,164,735 B2
(45) Date of Patent: Dec. 25, 2018

(54) ADAPTIVE MODULATION AND CODING METHOD, APPARATUS, AND SYSTEM

(71) Applicant: Huawei Technologies Co., Ltd., Shenzhen (CN)

(72) Inventors: Fan Yu, Chengdu (CN); Mo Li, Chengdu (CN); Lili Jin, Chengdu (CN)

(73) Assignee: Huawei Technologies Co., Ltd, Shenzhen (CN)

( * ) Notice: Subject to any disclaimer, the term of this patent is extended or adjusted under 35 U.S.C. 154(b) by 111 days.

(21) Appl. No.: 15/281,985

(22) Filed: Sep. 30, 2016

(65) Prior Publication Data

US 2017/0019210 A1    Jan. 19, 2017

Related U.S. Application Data

(63) Continuation of application No. PCT/CN2014/074542, filed on Apr. 1, 2014.

(51) Int. Cl.
  *H04L 1/00* (2006.01)
  *H04N 1/00* (2006.01)
  (Continued)

(52) U.S. Cl.
  CPC ...... *H04L 1/0041* (2013.01); *H03M 13/2906* (2013.01); *H04L 1/0003* (2013.01);
  (Continued)

(58) Field of Classification Search
  CPC ..... H04L 1/0041; H04L 1/0058; H04L 1/007; H04L 1/0045; H04L 1/0003;
  (Continued)

(56) References Cited

U.S. PATENT DOCUMENTS 7,802,172 B2    9/2010    Vila Casado et al.
2005/0041563 A1   2/2005   Tawaragi et al.
(Continued)

FOREIGN PATENT DOCUMENTS

CN    101018105 A    8/2007
CN    101043483 A    9/2007
(Continued)

OTHER PUBLICATIONS

D. Zou, T. Liu, I. B. Djordjevic and T. Wang, "Optimum signal constellation design and mapping rule for few-mode fiber based LDPC-coded CO-OFDM," CLEO: 2013, San Jose, CA, 2013, pp. 1-2.*

(Continued)

*Primary Examiner* — Cynthia Britt
(74) *Attorney, Agent, or Firm* — Slater Matsil, LLP

(57) ABSTRACT

Embodiments relate to the communications field, and provide an adaptive modulation and coding method, apparatus, and system. The method includes: obtaining to-be-processed data; obtaining channel information corresponding to the to-be-processed data, and determining a modulation mode according to the channel information. The method also includes determining first data and second data from the to-be-processed data according to the modulation mode; performing soft decision forward error correction FEC coding on the first data to obtain a first bit stream. The method also includes obtaining a second bit stream according to the second data, and modulating the first bit stream and the second bit stream according to a constellation mapping rule; and sending modulated data.

20 Claims, 13 Drawing Sheets

(51) Int. Cl.
*H03M 13/29* (2006.01)
*H03M 13/11* (2006.01)
*H03M 13/15* (2006.01)

(52) U.S. Cl.
CPC ............ *H04L 1/007* (2013.01); *H04L 1/0045* (2013.01); *H04L 1/0058* (2013.01); *H04N 1/00* (2013.01); *H03M 13/1111* (2013.01); *H03M 13/152* (2013.01); *H03M 13/1515* (2013.01)

(58) Field of Classification Search
CPC ........... H03M 13/2906; H03M 13/152; H03M 13/1515; H03M 13/1111; H04N 1/00
See application file for complete search history.

(56) References Cited

U.S. PATENT DOCUMENTS

| | | |
|---|---|---|
| 2006/0109821 A1 | 5/2006 | Xia |
| 2011/0167317 A1 | 7/2011 | Kim et al. |
| 2012/0300861 A1 | 11/2012 | Shen et al. |
| 2014/0153625 A1* | 6/2014 | Vojcic .................... H04L 1/005 375/224 |
| 2015/0171991 A1* | 6/2015 | Farjadrad .............. H04L 49/351 375/295 |
| 2016/0028417 A1 | 1/2016 | Yu et al. |
| 2017/0118062 A1* | 4/2017 | Loghin ............... H04L 27/3405 |
| 2017/0317759 A1* | 11/2017 | Agazzi ................. H04B 10/516 |

FOREIGN PATENT DOCUMENTS

| | | |
|---|---|---|
| CN | 101510791 A | 8/2009 |
| CN | 103503319 A | 1/2014 |
| EP | 2518925 A1 | 10/2012 |

OTHER PUBLICATIONS

The Authoritative Dictionary of IEEE Standards Terms, Seventh Edition, in IEEE Std 100-2000, vol., No. pp. 1-1362, Dec. 11, 2000 (excerpt only; cover pages and selected page—3 pages total).*

Yu, F., et al., "Hybrid Soft/Hard Decision Multilevel Coded Modulation for Beyond 100Gbps Optical Transmission," 39th European Conference and Exhibition on Optical Communication (ECOC), Sep. 22-26, 2013, 3 pages.

* cited by examiner

| Modulation mode | | QPSK | 8QAM | 16QAM | 32QAM | 64QAM | 128QAM | 256QAM | 512QAM | 1024QAM |
|---|---|---|---|---|---|---|---|---|---|---|
| First data | | b1b0 | b1b0 | b1b0 | b1b0 | b1b0 | b1b0 | b1b0 | b1b0 | b1b0 |
| Second data | Second coded data | Null | b2 | b3b2 | b3b2 | b3b2 | b3b2 | b3b2 | b3b2 | b3b2 |
| | Second original data | Null | Null | Null | b4 | b5b4 | b6b5b4 | b7b6b5b4 | b8b7b6b5b4 | b9b8b7b6b5b4 |

FIG. 2(a)

| Modulation mode | | QPSK | 8QAM | 16QAM | 32QAM | 64QAM | 128QAM | 256QAM | 512QAM | 1024QAM |
|---|---|---|---|---|---|---|---|---|---|---|
| First data | | b0 | b0 | b0 | b0 | b0 | b0 | b0 | b0 | b0 |
| Second data | Second coded data | b1 | b2b1 | b3b2 b1 | b3b2 b1 | b3b2 b1 | b3b2 b1 | b3b2 b1 | b3b2 b1 | b3b2 b1 |
| | Second original data | Null | Null | Null | b4 | b5b4 | b6b5 b4 | b7b6 b5b4 | b8b7b6b5 b4 | b9b8b7b6 b5b4 |

FIG. 2(b)

| Modulation mode | | QPSK | 8QAM | 16QAM | 32QAM | 64QAM | 128QAM | 256QAM | 512QAM | 1024QAM |
|---|---|---|---|---|---|---|---|---|---|---|
| First data | | b0 | b0 | b0 | b0 | b0 | b0 | b0 | b0 | b0 |
| Second data | Second coded data | b1 | b2b1 | b2b1 | b2b1 | b2b1 | b2b1 | b2b1 | b2b1 | b2b1 |
| | Second original data | Null | Null | b3 | b4b3 | b5b4 b3 | b6b5 b4b3 | b7b6 b5b4b3 | b8b7b6b5 b4b3 | b9b8b7b6 b5b4b3 |

FIG. 2(c)

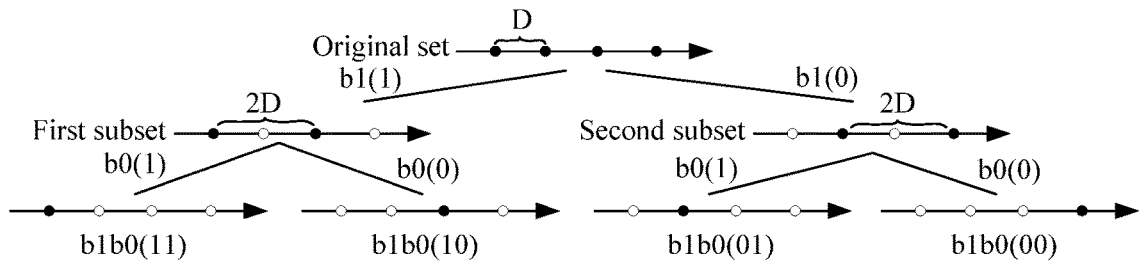
FIG. 3
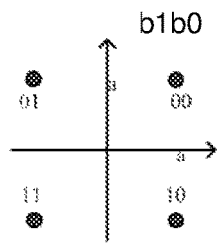
FIG. 4(a) Mapping in QPSK modulation
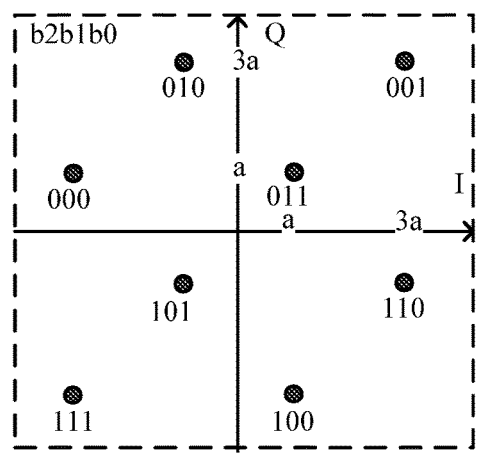
FIG. 4(b) Mapping in 8QAM modulation

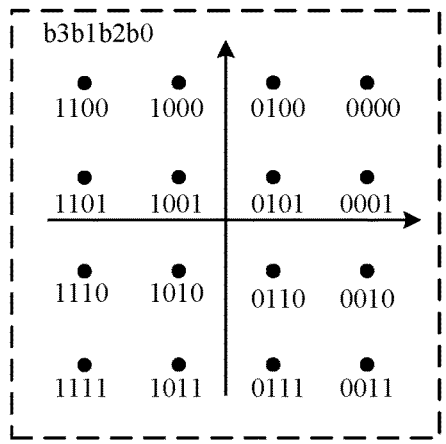
FIG. 4(c) Mapping in 16QAM modulation
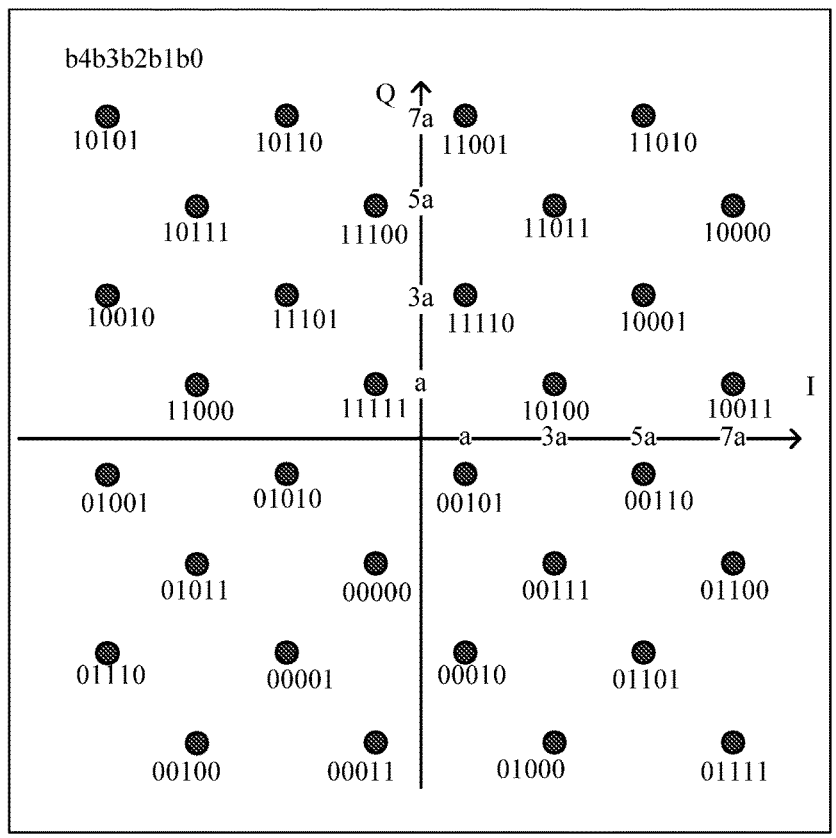
FIG. 4(d) Mapping in 32QAM modulation

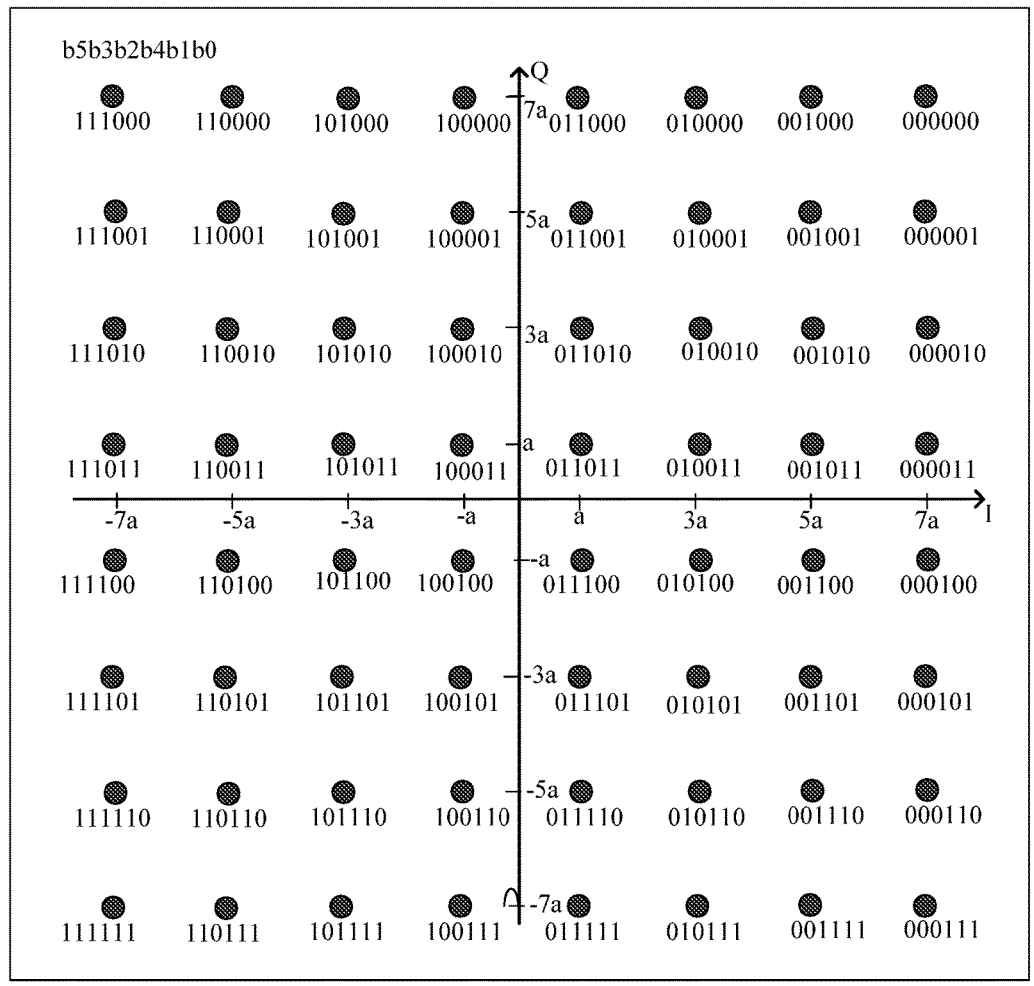
FIG. 4(e) Mapping in 64QAM modulation

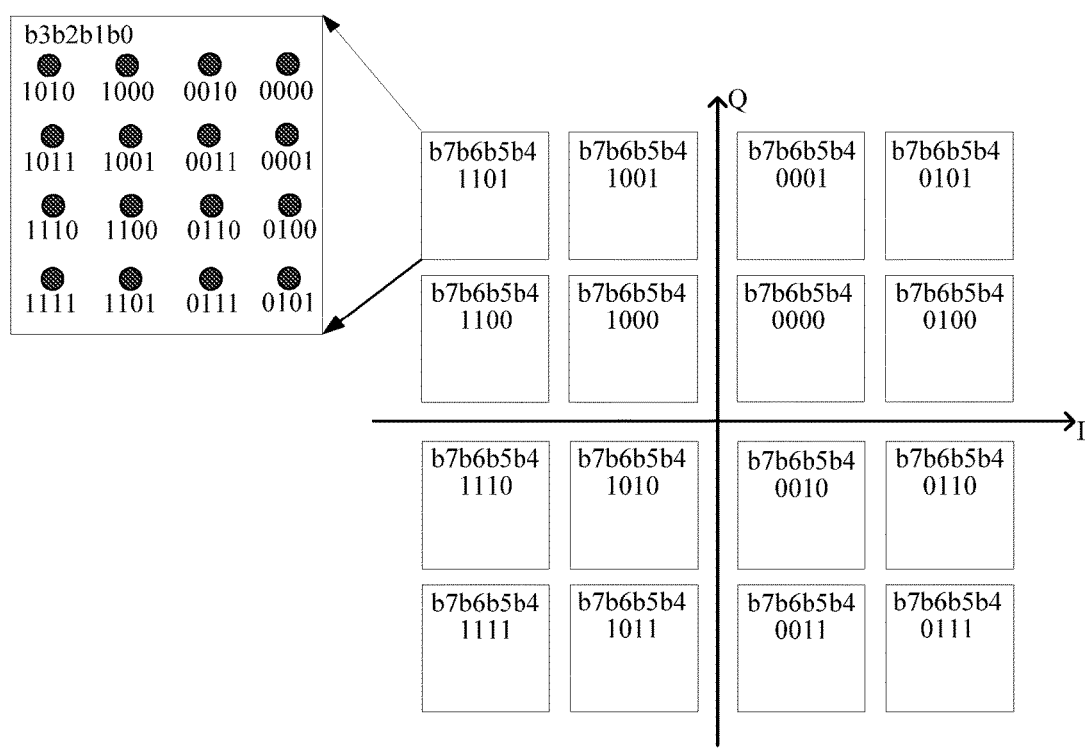
FIG. 4(f) Mapping in 256QAM modulation

ADAPTIVE MODULATION AND CODING METHOD, APPARATUS, AND SYSTEM

CROSS-REFERENCE TO RELATED APPLICATIONS

This application is a continuation of International Application No. PCT/CN2014/074542, filed on Apr. 1, 2014, the disclosure of which is hereby incorporated by reference in its entirety.

TECHNICAL FIELD

The present invention relates to the communications field, and in particular, to an adaptive modulation and coding method, apparatus, and system.

BACKGROUND

Adaptive Coding and Modulation (ACM) is a technology of adaptively changing a modulation scheme and an Forward Error Correction (FEC) coding scheme according to a channel status.

A core idea of the ACM is to obtain a relatively large throughput under the premise of not increasing a bit error rate, according to different requirement scenarios, by dynamically changing transmit power, a baud rate, a size of a constellation diagram, a coding scheme, a bit rate, and the like of a transmit end, in a relatively good channel condition, and by using higher order modulation and high bit rate FEC coding. When channel quality deteriorates, a system lowers a modulation order and uses low bit rate FEC coding, so as to lower a transmission rate to ensure transmission quality. In the prior art, the ACM is mainly implemented by using FEC codes of different lengths as the modulation order changes.

In the foregoing process in which the ACM is implemented, the inventor finds that the prior art has the following problems: To ensure smooth switching between different modulation and coding modes, an adaptive modulation and coding system needs to compatibly implement coding and decoding for different FEC code lengths and FEC bit rates, which consumes resources. In addition, when the adaptive modulation and coding system is upgraded, a higher-performance FEC code needs to be used or a modulation mode needs to be added, and all FEC codes of different lengths need to be re-designed in the prior art, which reduces system upgrade flexibility.

SUMMARY

Embodiments provide an adaptive modulation and coding method, apparatus, and system, to flexibly implement adaptive switching between multiple modulation and coding in an adaptive modulation and coding system, where an FEC code has features of good compatibility in multiple modulation modes and low complexity. When a higher-performance FEC needs to be used or a modulation mode needs to be added for system upgrade, not all FEC codes need to be re-designed, which improves system upgrade flexibility.

To achieve the foregoing objective, the following technical solutions are used in the embodiments.

According to a first aspect, an embodiment provides an adaptive modulation and coding method. The method includes obtaining to-be-processed data and obtaining channel information corresponding to the to-be-processed data, and determining a modulation mode according to the channel information. The method also includes determining first data and second data from the to-be-processed data according to the modulation mode. The method also includes performing soft decision forward error correction FEC coding on the first data to obtain a first bit stream; obtaining a second bit stream according to the second data. The method also includes modulating the first bit stream and the second bit stream according to a constellation mapping rule; and sending modulated data.

In a first possible implementation manner of the first aspect, the determining first data and second data from the to-be-processed data according to the modulation mode includes: determining, according to the modulation mode, a quantity of bits included in one symbol; dividing the to-be-processed data into at least one symbol according to the quantity of bits included in one symbol; determining data in a first bit group in each symbol as the first data, where the first bit group is a bit that is preset in each symbol by a system; and determining data in a second bit group in each symbol as the second data, where the second bit group is a bit in each symbol except the first bit group.

With reference to the first aspect or the first possible implementation manner of the first aspect, in a second possible implementation manner of the first aspect, the obtaining a second bit stream according to the second data includes: determining whether to partition the second data; and in a case in which it is determined that the second data is not to be partitioned, performing hard decision FEC coding on the second data to obtain the second bit stream; or in a case in which it is determined that the second data is to be partitioned, determining second coded data and second original data from the second data, where the second original data is data in the second data except the second coded data, and determining data obtained by combining the second original data and data that is obtained after hard decision FEC coding is performed on the second coded data, as the second bit stream.

With reference to the second possible implementation manner of the first aspect, in a third possible implementation manner of the first aspect, the constellation mapping rule includes: in the case in which it is determined that the second data is not to be partitioned, a UP mapping is used between the first bit stream and the second bit stream; or the constellation mapping rule includes: in the case in which it is determined that the second data is to be partitioned, a Gray mapping is used between the second original data, and a UP mapping is used between the first bit stream, the data obtained after the hard decision FEC coding is performed on the second coded data, and the second original data.

With reference to the first aspect or any one of the first to third possible implementation manners of the first aspect, in a fourth possible implementation manner of the first aspect, the method further includes: sending modulation information, where the modulation information records information related to the modulation mode.

With reference to the first aspect or any one of the first to fourth possible implementation manners of the first aspect, in a fifth possible implementation manner of the first aspect, the soft decision FEC coding includes: a low-density parity-check code LDPC, a convolutional LDPC code, or a polar code.

With reference to any one of the second to fifth possible implementation manners of the first aspect, in a sixth possible implementation manner of the first aspect, the hard decision FEC coding includes a BCH code or a Reed-Solomon code.

According to a second aspect, an embodiment provides an adaptive modulation and coding method. The method includes receiving data; obtaining modulation information, where the modulation information records information related to a modulation mode of the data. The method also includes performing soft demodulation on the data according to the modulation information to obtain first soft information, and performing soft decision forward error correction FEC decoding on the first soft information to obtain first data and log-likelihood ratio LLR information. The method also includes obtaining second data according to the modulation information, the LLR information, and the data; and combining the first data and the second data to obtain to-be-processed data.

In a first possible implementation manner of the second aspect, the obtaining second data according to the modulation information, the LLR information, and the data includes: determining, according to partition information corresponding to the modulation mode, whether to perform partition decoding on the data; and in a case in which it is determined that the partition decoding is not to be performed on the data, using the LLR information as prior information, performing soft demodulation on the data to obtain second soft information, and performing hard decision FEC decoding on the second soft information to obtain the second data; or in a case in which it is determined that the partition decoding is to be performed on the data, using the LLR information as prior information, performing soft demodulation on the data to obtain second soft information, and performing hard decision FEC decoding on the second soft information to obtain second coded data; using the LLR information and the second coded data as prior information, and demodulating the data to obtain second original data; and determining data obtained by combining the second coded data and the second original data, as the second data.

With reference to the second aspect or the first possible implementation manner of the second aspect, in a second possible implementation manner of the second aspect, the obtaining modulation information includes: receiving the modulation information; or obtaining channel information corresponding to the data, and determining the modulation information according to the channel information.

According to a third aspect, an embodiment of the present invention provides a sending device, including: a processor, configured to obtain to-be-processed data, where the processor is further configured to obtain channel information corresponding to the to-be-processed data, and determine a modulation mode according to the channel information; the processor is further configured to determine first data and second data from the to-be-processed data according to the modulation mode; the processor is further configured to perform soft decision forward error correction FEC coding on the first data to obtain a first bit stream; and the processor is further configured to obtain a second bit stream according to the second data; a modulator, configured to modulate the first bit stream and the second bit stream according to a constellation mapping rule, where the constellation mapping rule is a mapping rule corresponding to the modulation mode; and a transmitter, configured to send modulated data.

In a first possible implementation manner of the third aspect, the processor is specifically configured to determine, according to the modulation mode, a quantity of bits included in one symbol; the processor is specifically configured to divide the to-be-processed data into at least one symbol according to the quantity of bits included in one symbol; the processor is specifically configured to determine data in a first bit group in each symbol as the first data, where the first bit group is a bit that is preset in each symbol by a system; and the processor is specifically configured to determine data in a second bit group in each symbol as the second data, where the second bit group is a bit in each symbol except the first bit group.

With reference to the third aspect or the first possible implementation manner of the third aspect, in a second possible implementation manner of the third aspect, the processor is specifically configured to determine whether to partition the second data; and the processor is specifically configured to: in a case in which it is determined that the second data is not to be partitioned, perform hard decision FEC coding on the second data to obtain the second bit stream; or the processor is specifically configured to: in a case in which it is determined that the second data is to be partitioned, determine second coded data and second original data from the second data, where the second original data is data in the second data except the second coded data, and the processor is specifically configured to determine data obtained by combining the second original data and data that is obtained after hard decision FEC coding is performed on the second coded data, as the second bit stream.

With reference to the second possible implementation manner of the third aspect, in a third possible implementation manner of the third aspect, the constellation mapping rule includes: in the case in which it is determined that the second data is not to be partitioned, a UP mapping is used between the first bit stream and the second bit stream; or the constellation mapping rule includes: in the case in which it is determined that the second data is to be partitioned, a Gray mapping is used between the second original data, and a UP mapping is used between the first bit stream, the data obtained after the hard decision FEC coding is performed on the second coded data, and the second original data.

With reference to the third aspect or any one of the first to third possible implementation manners of the third aspect, in a fourth possible implementation manner of the third aspect, the transmitter is further configured to send modulation information, where the modulation information records information related to the modulation mode.

With reference to the third aspect or any one of the first to fourth possible implementation manners of the third aspect, in a fifth possible implementation manner of the third aspect, the soft decision FEC coding includes: a low-density parity-check code LDPC, a convolutional LDPC code, or a polar code.

With reference to any one of the second to fifth possible implementation manners of the third aspect, in a sixth possible implementation manner of the third aspect, the hard decision FEC coding includes a BCH code or a Reed-Solomon code.

According to a fourth aspect, an embodiment provides a receiving device. The device includes a receiver, configured to receive data; a processor, configured to obtain modulation information, where the modulation information records information related to a modulation mode of the data. The device also includes a demodulator, configured to perform soft demodulation on the data according to the modulation information to obtain first soft information, and perform soft decision forward error correction FEC decoding on the first soft information to obtain first data and log-likelihood ratio LLR information, where the demodulator is further configured to obtain second data according to the modulation information, the LLR information, and the data. The processor is further configured to combine the first data and the second data to obtain to-be-processed data.

In a first possible implementation manner of the fourth aspect, the demodulator is specifically configured to determine, according to partition information corresponding to the modulation mode, whether to perform partition decoding on the data; and the demodulator is specifically configured to: in a case in which it is determined that the partition decoding is not to be performed on the data, use the LLR information as prior information, perform soft demodulation on the data to obtain second soft information, and perform hard decision FEC decoding on the second soft information to obtain the second data; or the demodulator is specifically configured to: in a case in which it is determined that the partition decoding is to be performed on the data, use the LLR information as prior information, perform soft demodulation on the data to obtain second soft information, and perform hard decision FEC decoding on the second soft information to obtain second coded data; the demodulator is specifically configured to use the LLR information and the second coded data as prior information, and demodulate the data to obtain second original data; and the demodulator is specifically configured to determine data obtained by combining the second coded data and the second original data, as the second data.

With reference to the fourth aspect or the first possible implementation manner of the fourth aspect, in a second possible implementation manner of the fourth aspect, the processor is specifically configured to receive the modulation information; or the processor is specifically configured to obtain channel information corresponding to the data, and determine the modulation information according to the channel information.

According to a fifth aspect, an embodiment provides an adaptive modulation and coding system, including: a sending device and a receiving device, where the sending device is the sending device described in Embodiment 3, and the receiving device is the receiving device described in Embodiment 4.

The embodiments provide an adaptive modulation and coding method, apparatus, and system. To-be-processed data is obtained; then, channel information corresponding to the to-be-processed data is obtained, and a modulation mode is determined according to the channel information. First data and second data are determined from the to-be-processed data according to the modulation mode. Soft decision forward error correction FEC coding is performed on the first data to obtain a first bit stream; a second bit stream is obtained according to the second data. Finally, the first bit stream and the second bit stream are modulated according to a constellation mapping rule, and modulated data is sent. In this way, switching between different modulation modes can be implemented by performing a soft decision FEC code on the first data of a fixed length by using only one determined code length, and switching complexity is reduced. Moreover, when a higher-performance FEC needs to be used or a modulation mode needs to be added for system upgrade, not all FEC codes need to be re-designed, which improves system upgrade flexibility.

BRIEF DESCRIPTION OF THE DRAWINGS

To describe the technical solutions in the embodiments of the present invention more clearly, the following briefly describes the accompanying drawings required for describing the embodiments. Apparently, the accompanying drawings in the following description show merely some embodiments of the present invention, and persons of ordinary skill in the art may still derive other drawings from these accompanying drawings without creative efforts.

FIG. 2(a) to FIG. 2(c) are schematic diagrams of partition in different modulation modes according to an embodiment;

FIG. 3 is an exemplary diagram of a UP mapping according to an embodiment;

FIG. 4(a) to FIG. 4(f) are schematic diagrams of constellation mappings in different modulation modes according to an embodiment;

DETAILED DESCRIPTION OF ILLUSTRATIVE EMBODIMENTS

The following clearly describes the technical solutions in the embodiments of the present invention with reference to the accompanying drawings in the embodiments of the present invention. Apparently, the described embodiments are merely some but not all of the embodiments of the present invention. All other embodiments obtained by persons of ordinary skill in the art based on the embodiments of the present invention without creative efforts shall fall within the protection scope of the present invention.

Figure 1:
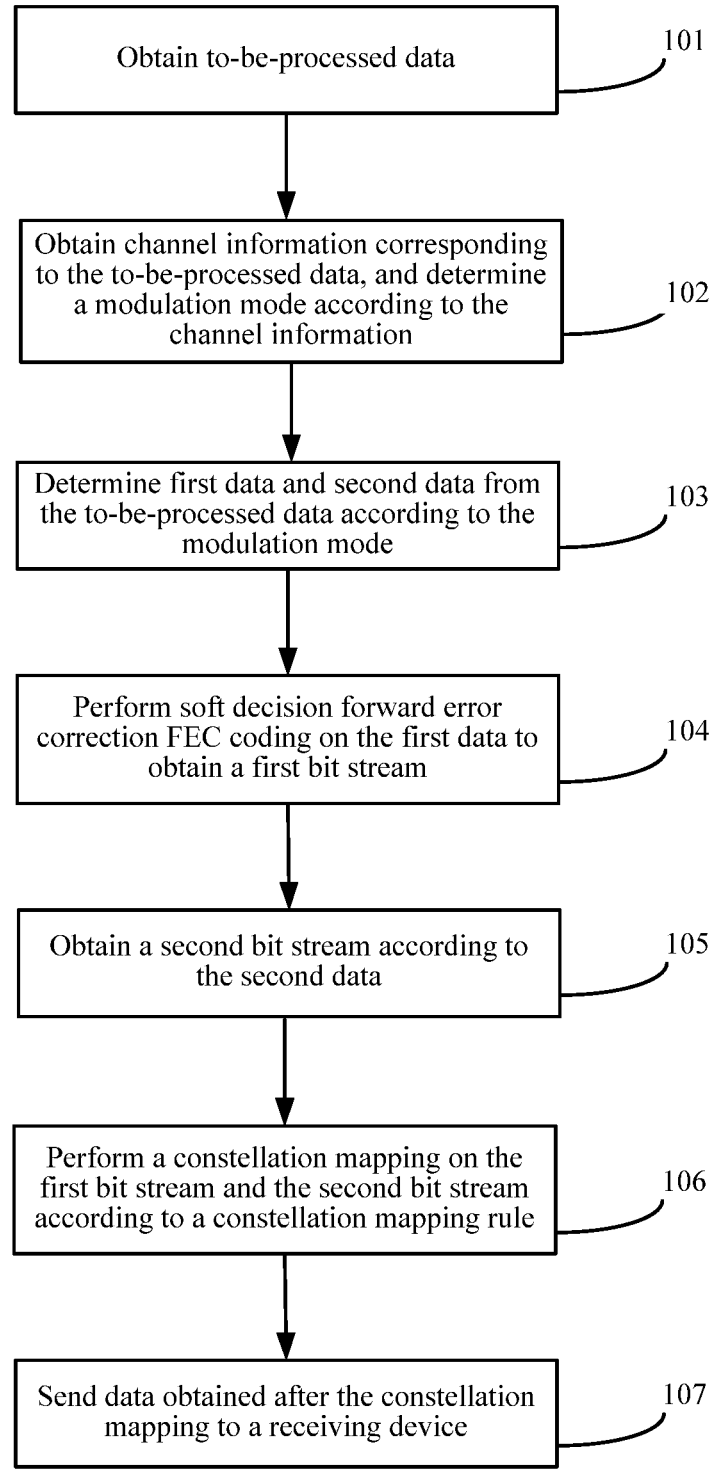
FIG. 1 is a schematic flowchart of an adaptive modulation and coding method according to an embodiment.

An embodiment provides an adaptive modulation and coding method. As shown in FIG. 1, the method includes the following steps.

101: Obtain to-be-processed data.

It should be noted that, the to-be-processed data is data obtained after analog-to-digital conversion is performed, that is, the to-be-processed data is a digital signal.

It should be noted that, the to-be-processed data is data that needs to be processed and then needs to be sent.

102: Obtain channel information corresponding to the to-be-processed data, and determine a modulation mode according to the channel information.

Specifically, which device the to-be-processed data needs to be sent to after the to-be-processed data is processed is determined, information such as quality of a channel and/or a transmission distance to the determined device is obtained, and a modulation mode is determined.

It should be noted that, the modulation mode includes: QPSK (Quadrature Phase Shift Keying), 8QAM (Quadrature Amplitude Modulation), 16QAM, 32QAM, 64QAM, 128QAM, 256QAM, 512QAM, or 1024QAM.

It should be noted that, a modulation order corresponding to the modulation mode is sequentially 2-order, 3-order, 4-order, 5-order, 6-order, 7-order, 8-order, 9-order, or 10-order.

It should be noted that, in a case in which the quality of the channel is relatively good, a modulation mode of a relatively high modulation order is used; in a case in which the quality of the channel is relatively poor, a modulation mode of a relatively low modulation order is used.

It should be noted that, a method for obtaining channel information and determining a modulation mode according to the channel information is the same as a method for obtaining channel information and determining a modulation mode according to the channel information in the prior art, and details are not described herein.

103: Determine first data and second data from the to-be-processed data according to the modulation mode.

It should be noted that, the to-be-processed data includes only first data and second data, and the second data is data in the to-be-processed data except the first data, that is, the sending device needs to determine only the first data from the to-be-processed data, and remaining data is the second data.

Specifically, the determining first data and second data from the to-be-processed data according to the modulation mode includes the following.

S1: The sending device determines, according to the modulation mode, a quantity of bits included in one symbol.

Specifically, the sending device determines, according to a modulation order corresponding to the modulation mode, a quantity of bits included in one symbol.

It should be noted that, the symbol is a basic unit for the sending device to modulate the to-be-processed data.

S2: Divide the to-be-processed data into at least one symbol according to the quantity of bits included in one symbol.

Specifically, the to-be-processed data is divided into at least one symbol according to a receiving order and the quantity of bits included in one symbol.

S3: Determine data in a first bit group in each symbol as the first data.

The first bit group is a bit that is preset in each symbol by a system.

It should be noted that, the first bit group is related to a modulation mode of a lowest order in the system. When a lowest modulation order in the system is 3-order, because one symbol includes only three bits, a bit in the first bit group can only be selected from three lowest bits in each symbol. If the bit in the first bit group includes a fourth bit, during 3-order modulation, a coding error and a modulation error occur due to a partition error, and consequently, demodulated data is incorrect.

Exemplarily, when the system has modulation modes of QPSK, 8QAM, 16QAM, and 32QAM, and modulation orders are respectively 2-order, 3-order, 4-order, and 5-order, because a lowest modulation order is 2-order, in this case, the first bit group may be set to the first bit and/or the second bit in a symbol.

Further, because a bit error rate of low-bit data in a symbol is greater than a bit error rate of high-bit data in the symbol during modulation, preferably, the low-bit data in the symbol may be determined as the first data, and soft decision FEC (Forward Error Correction, forward error correction) coding having relatively high gain performance is performed, so as to reduce the bit error rate of the low-bit data.

It should be noted that, during modulation mode switching, the first bit group is not changed, that is, a quantity of bits on which the soft decision FEC coding needs to be performed remains unchanged, and therefore, a code word for the soft decision FEC coding does not need to be changed, so that a same soft decision FEC code word can be used in different modulation modes.

S4: Determine data in a second bit group in each symbol as the second data.

The second bit group is a bit in each symbol except the first bit group.

It should be noted that, there is no chronological order between step 104 and step 105: Step 104 may be first performed, and then step 105 is performed; or step 105 may be first performed, and then step 104 is performed; or step 104 and step 105 may be simultaneously performed. In this embodiment, an example in which step 104 is first performed and then step 105 is performed is used.

Perform soft decision forward error correction FEC coding on the first data to obtain a first bit stream.

Further, the soft decision FEC coding includes an LDPC code (low-density parity-check code, Low-density parity-check Code), a convolutional LDPC code, or a polar code (polar code).

It should be noted that, the soft decision FEC coding may include, but is not limited to, the foregoing soft decision FEC coding scheme, or may be another soft decision FEC coding scheme in the prior art, which is not limited in the present invention.

It should be noted that, a method for performing soft decision forward error correction FEC coding on the first data to obtain a first bit stream is the same as a method for performing soft decision FEC coding on data in the prior art, and details are not described herein.

It should be noted that, the soft decision FEC coding is a coding scheme having highest gain performance among FEC coding, but is also a most complex coding scheme.

105: Obtain a second bit stream according to the second data.

Further, the obtaining a second bit stream according to the second data includes:

T1: Determine whether to partition the second data.

Specifically, the sending device may determine, according to the modulation order, whether to partition the second data. When the modulation order is relatively high, the sending device determines to partition the second data.

Exemplarily, the sending device determines whether the modulation order corresponding to the modulation mode is higher than 4. When the modulation order is higher than 4, the second data is to be partitioned. When the modulation order is not higher than 4, the second data is not to be partitioned.

It should be noted that, different steps are performed according to different determining results. In a case in which it is determined that the second data is not to be partitioned, step T2 is performed, and steps T3 and T4 are not performed. In a case in which it is determined that the second data is to be partitioned, steps T3 and T4 are performed, and step T2 is not performed.

T2: In a case in which it is determined that the second data is not to be partitioned, perform hard decision FEC coding on the second data to obtain the second bit stream.

Specifically, in a case in which the modulation order corresponding to the modulation mode is relatively low, the second data is not to be partitioned for separate processing, and the hard decision FEC coding may be directly performed on the second data.

It should be noted that, in a case in which modulation orders are different but quantities of bits in each symbol that are determined as the first data are the same, quantities of bits, of the second data, in each symbol are different.

It should be noted that, gain performance of the hard decision FEC coding is lower than that of the soft decision FEC coding, but the hard decision FEC coding is less complex than the soft decision FEC coding.

T3: In a case in which it is determined that the second data is to be partitioned, determine second coded data and second original data from the second data.

The second original data is data in the second data except the second coded data.

It should be noted that, in a case in which the modulation order is relatively high, the second data is to be partitioned, where hard decision FEC coding is performed on a part of the second data, and the other part is not coded.

It should be noted that, as long as the second coded data is determined, data that is neither the first data nor the second coded data is the second original data.

It should be noted that, because a bit error rate of high-bit data in a symbol is relatively small due to design of a modulation mapping, the high-bit data may be not coded, so that when a system is upgraded to a higher-order modulation mode, only partition of the part that is not coded needs to be changed, and the first data and the second coded data do not need to be changed.

T4: Determine data obtained by combining the second original data and data that is obtained after hard decision FEC coding is performed on the second coded data, as the second bit stream.

Further, the hard decision FEC coding includes a BCH (Bose Ray-Chaudhuri Hocquenghem) code or a Reed-Solomon code.

It should be noted that, the hard decision FEC coding may include, but is not limited to, the foregoing hard decision FEC coding scheme, or may be another hard decision FEC coding scheme in the prior art, which is not limited in the present invention.

It should be noted that, a method for performing hard decision forward error correction FEC coding on the second coded data is the same as a method for performing hard decision FEC coding on data in the prior art, and details are not described herein.

It should be noted that, the second bit stream consists of the data obtained after the hard decision coding is performed and the original data that is not coded.

Exemplarily, data partition by the sending device in different modulation modes may be shown in FIG. 2(a) to FIG. 2(c), where b0, b1, . . . , and b9 indicate an order from a low bit to a high bit in a symbol.

106: Modulate the first bit stream and the second bit stream according to a constellation mapping rule.

The constellation mapping rule is a mapping rule corresponding to the modulation mode.

Further, the constellation mapping rule includes: in the case in which it is determined that the second data is not to be partitioned, a UP (Ungerboeck Partitioning) mapping is used between the first bit stream and the second bit stream; or the constellation mapping rule includes: in the case in which the sending device determines to partition the second data, a Gray mapping is used between the second original data, and a UP mapping is used between the first bit stream obtained after the soft decision FEC coding is performed on the first data, the data obtained after the hard decision FEC coding is performed on the second coded data, and the second original data.

It should be noted that, the UP mapping is a symbol mapping based on partition of a signal set. After each time of partition of a set, a parameter of a distance between signal points in a subset is greater than a parameter of a distance between signal points in an upper-level subset. During UP partition, as a quantity of times of partition increases, a minimum Euclidean distance between adjacent signal points in a same signal set constantly increase, thereby enhance an anti-interference capability of a signal.

Exemplarily, a 16QAM mapping is described herein by using two one-dimensional 4-ASKs (Amplitude Shift Keying). As shown in FIG. 3, coordinates shown in the figure represent a coordinate axis in a constellation diagram, and a Euclidean distance between adjacent signal points is D. One 4-ASK symbol includes information of two bits: b1 and b0, and is represented by using four signal points. As shown in the figure, a minimum Euclidean distance between two adjacent signal points in an original set is D. During the first time of partition, b1 having a relatively high bit is partitioned, to obtain a first subset in which a minimum Euclidean distance between two adjacent signal points is 2D, and a second subset in which a minimum Euclidean distance between two adjacent signal points is also 2D. It should be noted that, b1(1) in FIG. 3 indicates that data of b1 is 1, and corresponding content may be obtained analogically.

Exemplarily, FIG. 4(a) to FIG. 4(f) provide diagrams of constellation mappings in different modulation modes. A coordinate axis I and a coordinate axis Q in each diagram respectively represent two signals, and the signal Q is orthogonal to the signal I. Horizontal and vertical coordinates in the diagram respectively represent amplitudes of the signal I and the signal Q.

107: Send modulated data.

Figure 5:
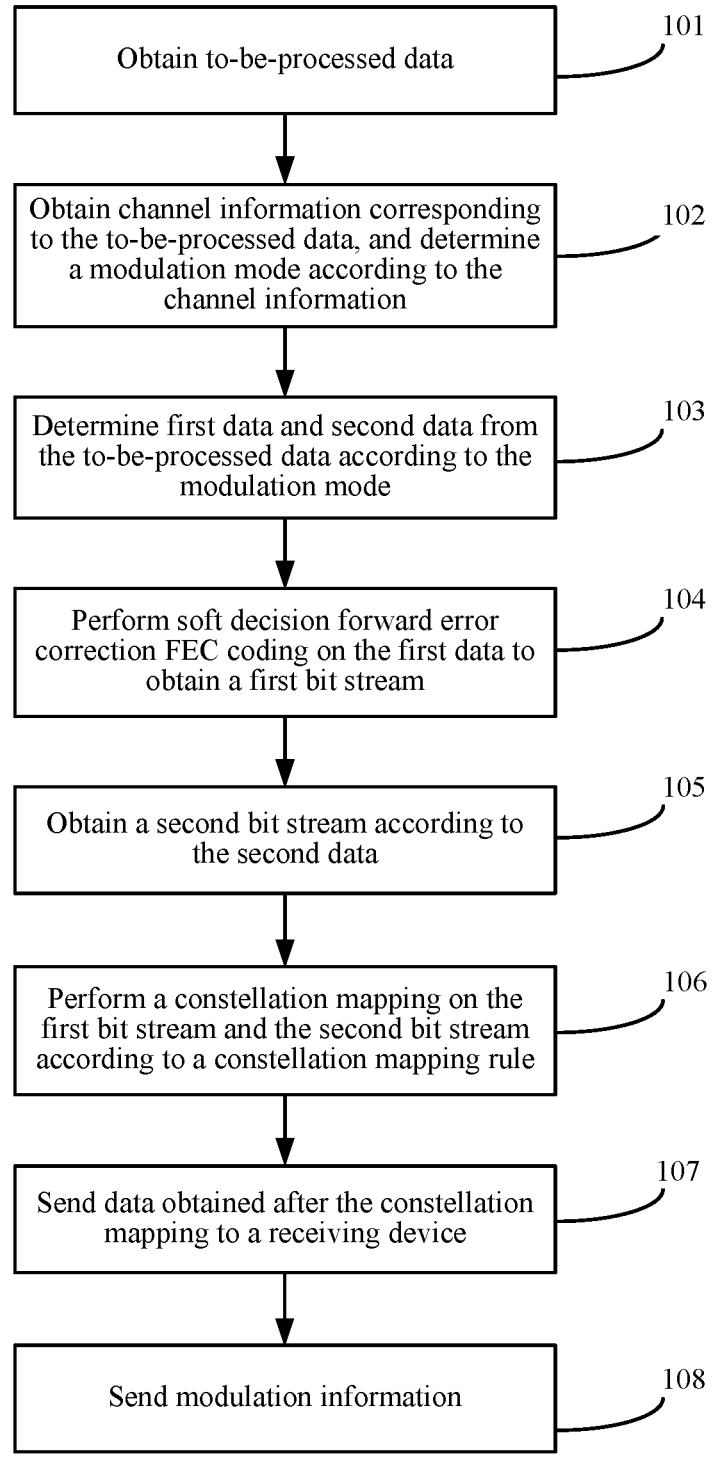
FIG. 5 is a schematic flowchart of another adaptive modulation and coding method according to an embodiment.

Further, as shown in FIG. 5, the method further includes:

108: Send modulation information.

The modulation information records information related to the modulation mode.

It should be noted that, the information related to the modulation mode is sent to a device that needs to demodulate the modulated data, so that the device learns how the received data is modulated and further determines a demodulation scheme corresponding to the modulation mode.

It should be noted that, as long as step 108 is performed after step 102 of determining a modulation mode, orders between step 108 and step 103, step 104, step 105, step 106, and step 107 are not limited in the present invention. Herein, an example in which steps 102 to 107 are first performed, and then step 108 is performed is used.

This embodiment provides an adaptive modulation and coding method. To-be-processed data is obtained; then, channel information corresponding to the to-be-processed data is obtained, and a modulation mode is determined according to the channel information; further, first data and second data are determined from the to-be-processed data according to the modulation mode; soft decision forward error correction FEC coding is performed on the first data to obtain a first bit stream; a second bit stream is obtained according to the second data; and finally, the first bit stream and the second bit stream are modulated according to a constellation mapping rule, and modulated data is sent. In this way, switching between different modulation modes can be implemented by performing a soft decision FEC code on the first data of a fixed length by using only one determined code length, and switching complexity is reduced. Moreover, when a higher-performance FEC needs to be used or a modulation mode needs to be added for system upgrade, not all FEC codes need to be re-designed, which improves system upgrade flexibility.

Figure 6:
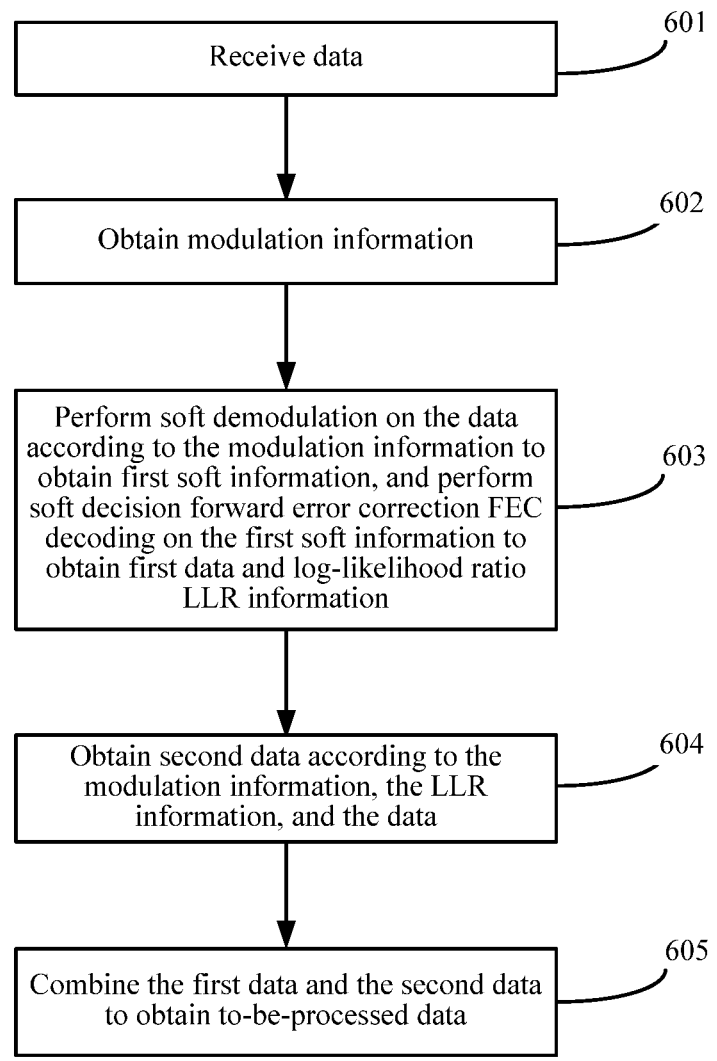
FIG. 6 is a schematic flowchart of another adaptive modulation and coding method according to an embodiment.

An embodiment provides an adaptive modulation and coding method. As shown in FIG. 6, the method includes the following steps.

601: Receive data.

Specifically, modulated data is received.

602: Obtain modulation information.

The modulation information records information related to a modulation mode of the data.

It should be noted that, a modulation mode can be determined according to the modulation information; and partition demodulation and separate decoding are performed on the received data according to partition that is preset by a system and that corresponds to the modulation mode.

Further, there are two methods for obtaining the modulation information.

A first method is to receive the modulation information.

It should be noted that, in this case, a device that modulates the data may send the modulation information by means of transmission of a control layer.

A second method is to obtain channel information corresponding to the data, and determine the modulation information according to the channel information.

It should be noted that, information such as quality of a channel and/or a transmission distance corresponding to the data is obtained, and the modulation mode is determined.

It should be noted that, there is no chronological order between step 601 and step 602: Step 601 may be first performed, and then step 602 is performed; or step 602 may be first performed, and then step 601 is performed; or step 602 and step 601 may be simultaneously performed. In this embodiment, an example in which step 601 is first performed and then step 602 is performed is used.

603: Perform soft demodulation on the data according to the modulation information to obtain first soft information, and perform soft decision forward error correction FEC decoding on the first soft information to obtain first data and LLR (Log-likelihood ratio, log-likelihood ratio) information.

Specifically, a receiving device first demodulates the received data according to a partition relationship to obtain soft information of a first data stream, performs soft decision FEC decoding on the obtained soft information, and obtains LLR information after the soft decision FEC decoding.

Exemplarily, in the case of a 16QAM modulation mode shown in FIG. 2(*a*), each symbol in the received data is demodulated to obtain soft information (b1 and b0) of two low bits in four bits, soft decision FEC decoding is performed on the soft information (b1 and b0), and LLR information after the soft decision FEC decoding is obtained.

Exemplarily, in the case of a 64QAM modulation mode shown in FIG. 2(*a*), each symbol in the received data is first demodulated to obtain soft information (b1 and b0) of two low bits in eight bits, soft decision FEC decoding is performed on the soft information (b1 and b0), and LLR information after the soft decision FEC decoding is obtained.

604: Obtain second data according to the modulation information, the LLR information, and the data.

Further, the obtaining second data according to the modulation information, the LLR information, and the data includes the following steps:

Q1: Determine, according to partition information corresponding to the modulation mode, whether to perform partition decoding on the data.

It should be noted that, different steps are performed according to different determining results. In a case in which it is determined that the second data is not to be partitioned, step T2 is performed, and steps T3 and T4 are not performed. In a case in which it is determined that the second data is to be partitioned, steps T3 and T4 are performed, and step T2 is not performed.

It should be noted that, different steps are performed according to different determining results. In a case in which it is determined that the partition decoding is not to be performed on the data, step Q2 is performed, and steps Q3 to Q5 are not performed. In a case in which it is determined that the second data is to be partitioned, steps Q3 to Q5 are performed, and step Q2 is not performed.

Q2: In a case in which it is determined that the partition decoding is not to be performed on the data, use the LLR information as prior information, perform soft demodulation on the data to obtain second soft information, and perform hard decision FEC decoding on the second soft information to obtain the second data.

Exemplarily, in the case of the 16QAM modulation mode shown in FIG. 2(*a*), the LLR information after the soft decision FEC decoding is used as prior information, the received data is demodulated to obtain information (b3 and b2) of two high bits in four bits in each symbol, and hard decision FEC decoding is performed on b3 and b2.

Q3: In a case in which it is determined that the partition decoding is to be performed on the data, use the LLR information as prior information, perform soft demodulation on the data to obtain second soft information, and perform hard decision FEC decoding on the second soft information to obtain second coded data.

Q4: Use the LLR information and the second coded data as prior information, and demodulate the data to obtain second original data.

Q5: Determine data obtained by combining the second coded data and the second original data, as the second data.

Exemplarily, in the case of the 64QAM modulation mode shown in FIG. 2(*a*), the LLR information after the soft decision FEC decoding is used as prior information, the received data is demodulated to obtain information (b3 and b2) of two high bits in four bits in each symbol, and hard decision FEC decoding is performed on b3 and b2; and finally, the LLR information after the soft decision FEC decoding and the bit information after the hard decision FEC decoding are used as prior information, and the received data is demodulated to obtain information of two highest bits in eight bits in each symbol.

Figure 7:
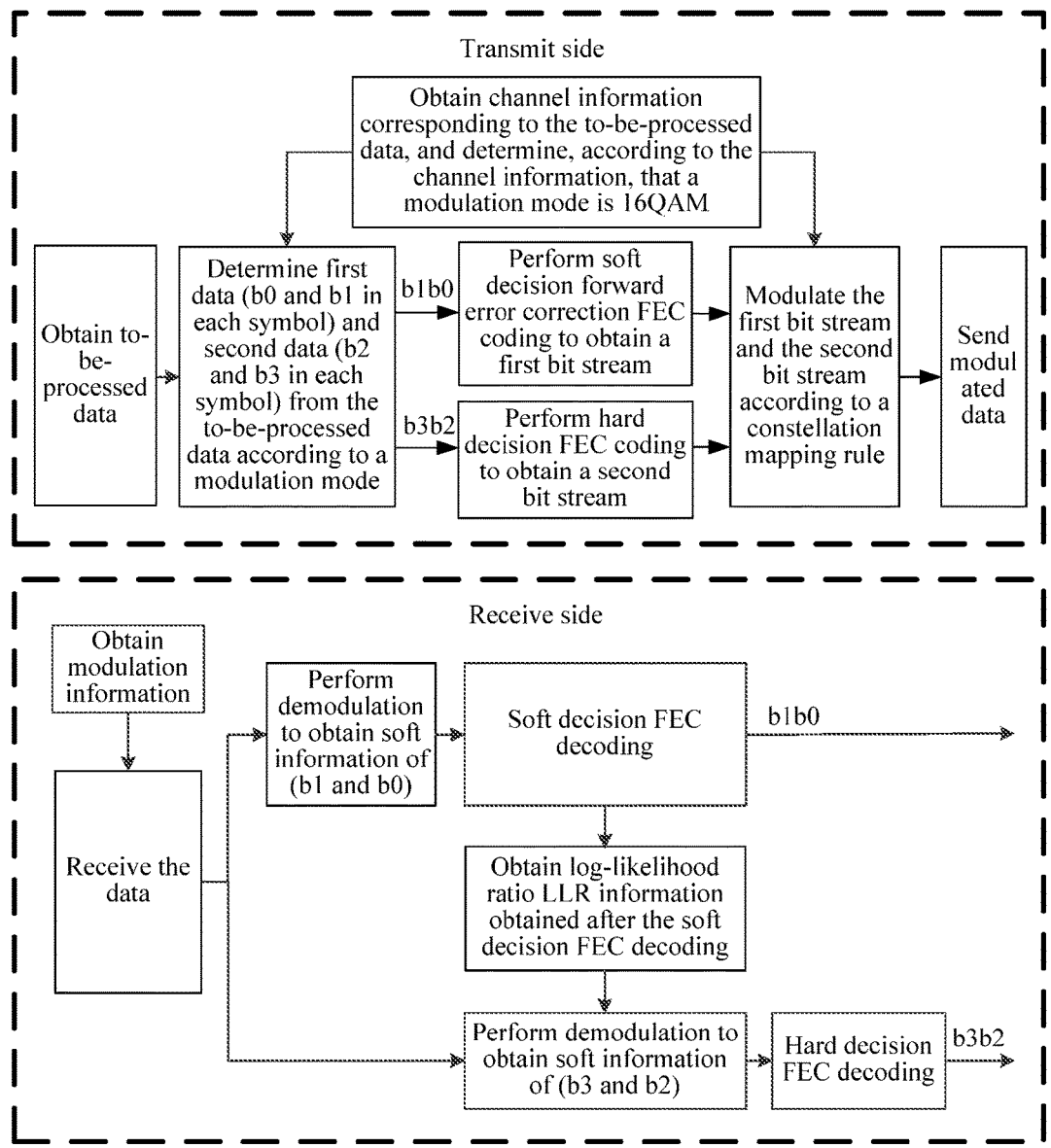
FIG. 7 is a schematic diagram of a data processing process in a 16QAM modulation mode according to an embodiment.
Figure 8:
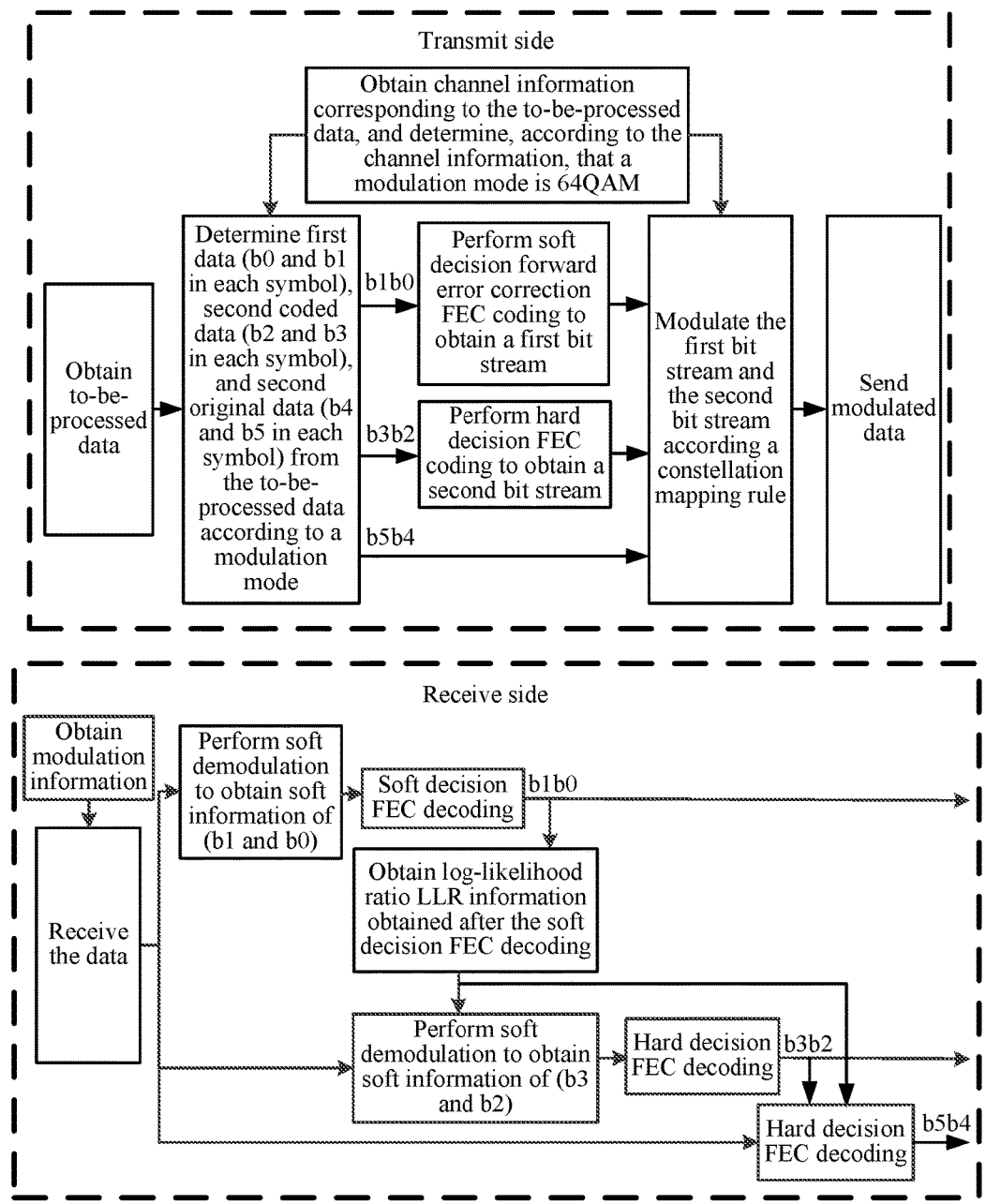
FIG. 8 is a schematic diagram of a data processing process in a 64QAM modulation mode according to an embodiment.

Exemplarily, for processing of data in 16QAM and 64QAM modulation modes according to a data partition method in FIG. 2(*a*), respectively refer to FIG. 7 and FIG. 8.

605: Combine the first data and the second data to obtain to-be-processed data.

It should be noted that, the first data and the second data are combined according to the partition relationship corresponding to the modulation mode, to obtain final data.

This embodiment provides an adaptive modulation and coding method. Data is received; modulation information is obtained; then, soft demodulation is performed on the data according to the modulation information to obtain first soft information, and soft decision forward error correction FEC decoding is performed on the first soft information to obtain first data and log-likelihood ratio LLR information; second data is obtained according to the modulation information, the LLR information, and the data; and finally, the first data and the second data are combined to obtain to-be-processed data. Because during modulation by a transmit side, soft decision FEC coding is performed only on data of a fixed bit in a symbol, when the received data is demodulated, the data is demodulated by using only a soft decision FEC decoding method corresponding to the soft decision FEC coding method, thereby improving system flexibility.

Figure 9:
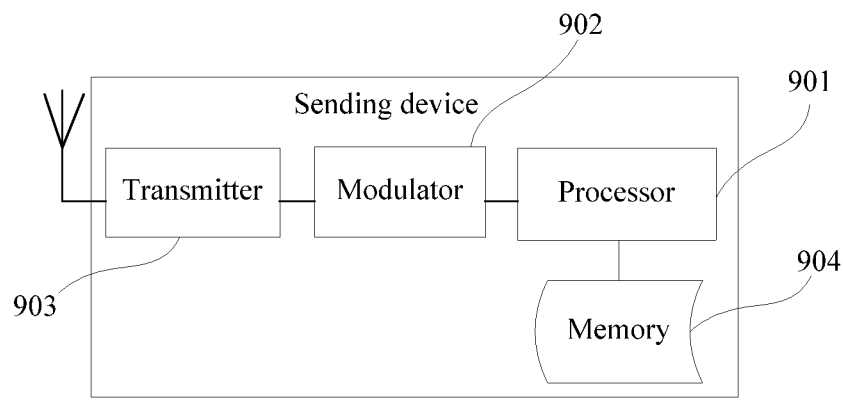
FIG. 9 is a schematic structural diagram of a sending device according to an embodiment.

As shown in FIG. 9, FIG. 9 is a schematic structural diagram of a sending device according to an embodiment of the present invention. Referring to FIG. 9, the sending device includes a processor 901, a modulator 902, a transmitter 903, and a memory 904.

The memory 904 is configured to store a set of program code, and the processor 901 can invoke the program code stored in the memory 904.

The processor 901 is configured to obtain to-be-processed data.

The processor 901 is further configured to obtain channel information corresponding to the to-be-processed data, and determine a modulation mode according to the channel information.

The processor 901 is further configured to determine first data and second data from the to-be-processed data according to the modulation mode.

Further, the processor 901 is specifically configured to determine, according to the modulation mode, a quantity of bits included in one symbol. The processor 901 is specifically configured to divide the to-be-processed data into at least one symbol according to the quantity of bits included in one symbol. The processor 901 is specifically configured to determine data in a first bit group in each symbol as the first data. The first bit group is a bit that is preset in each symbol by a system. The processor 901 is specifically configured to determine data in a second bit group in each symbol as the second data, where the second bit group is a bit in each symbol except the first bit group.

The processor 901 is further configured to perform soft decision forward error correction FEC coding on the first data to obtain a first bit stream.

Further, the soft decision FEC coding includes: a low-density parity-check code LDPC, a convolutional LDPC code, or a polar code.

The processor 901 is further configured to obtain a second bit stream according to the second data.

Further, the processor 901 is specifically configured to determine whether to partition the second data, where the processor 901 is specifically configured to: in a case in which it is determined that the second data is not to be partitioned, perform hard decision FEC coding on the second data to obtain the second bit stream; or the processor 901 is specifically configured to: in a case in which it is determined that the second data is to be partitioned, determine second coded data and second original data from the second data, where the second original data is data in the second data except the second coded data, and the processor 901 is specifically configured to determine data obtained by combining the second original data and data that is obtained after hard decision FEC coding is performed on the second coded data, as the second bit stream.

Further, the hard decision FEC coding includes a BCH code or a Reed-Solomon code.

The modulator 902 is configured to modulate the first bit stream and the second bit stream according to a constellation mapping rule, where the constellation mapping rule is a mapping rule corresponding to the modulation mode.

Further, the constellation mapping rule includes: in the case in which it is determined that the second data is not to be partitioned, a UP mapping is used between the first bit stream and the second bit stream. Alternatively, the constellation mapping rule includes: in the case in which it is determined that the second data is to be partitioned, a Gray mapping is used between the second original data, and a UP mapping is used between the first bit stream, the data obtained after the hard decision FEC coding is performed on the second coded data, and the second original data.

The transmitter 903 is configured to send modulated data.

The transmitter 903 is further configured to send modulation information, where the modulation information records information related to the modulation mode.

This embodiment provides a sending device, which obtains to-be-processed data; then obtains channel information corresponding to the to-be-processed data, and determines a modulation mode according to the channel information; further determines first data and second data from the to-be-processed data according to the modulation mode; performs soft decision forward error correction FEC coding on the first data to obtain a first bit stream; obtains a second bit stream according to the second data; and finally modulates the first bit stream and the second bit stream according to a constellation mapping rule, and sends modulated data. In this way, switching between different modulation modes can be implemented by performing a soft decision FEC code on the first data of a fixed length by using only one determined code length, and switching complexity is reduced. Moreover, when a higher-performance FEC needs to be used or a modulation mode needs to be added for system upgrade, not all FEC codes need to be re-designed, which improves system upgrade flexibility.

Figure 10:
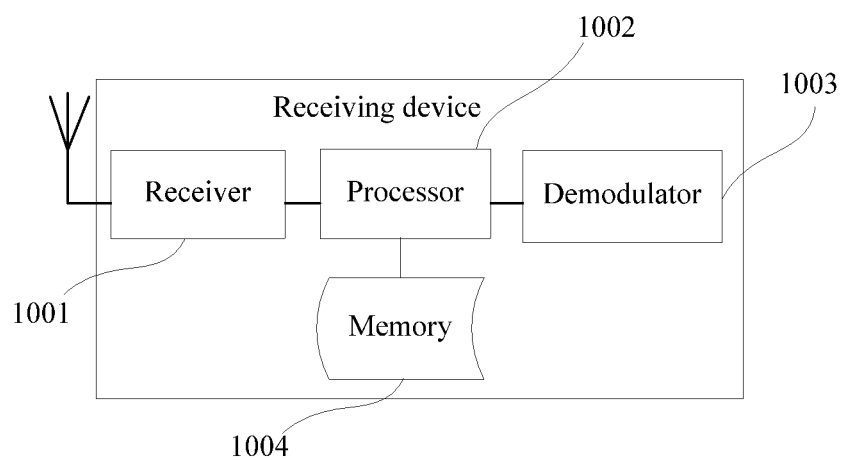
FIG. 10 is a schematic structural diagram of a receiving device according to an embodiment.

As shown in FIG. 10, FIG. 10 is a schematic structural diagram of a receiving device according to an embodiment of the present invention. Referring to FIG. 10, the receiving device includes: a receiver 1001, a processor 1002, a demodulator 1003, and a memory 1004.

The memory 1004 is configured to store a set of program code, and the processor 1002 can invoke the program code stored in the memory 1004.

The receiver 1001 is configured to receive data.

The processor 1002 is configured to obtain modulation information, where the modulation information records information related to a modulation mode of the data.

Further, the processor 1002 is specifically configured to receive the modulation information; or the processor 1002 is specifically configured to obtain channel information corresponding to the data, and determine the modulation information according to the channel information.

The demodulator 1003 is configured to perform soft demodulation on the data according to the modulation information to obtain first soft information, and perform soft decision forward error correction FEC decoding on the first soft information to obtain first data and log-likelihood ratio LLR information.

The demodulator 1003 is further configured to obtain second data according to the modulation information, the LLR information, and the data.

Further, the demodulator 1003 is specifically configured to determine, according to partition information corresponding to the modulation mode, whether to perform partition decoding on the data; and the demodulator 1003 is specifically configured to: in a case in which it is determined that the partition decoding is not to be performed on the data, use the LLR information as prior information, perform soft demodulation on the data to obtain second soft information, and perform hard decision FEC decoding on the second soft information to obtain the second data; or the demodulator 1003 is specifically configured to: in a case in which it is determined that the partition decoding is to be performed on the data, use the LLR information as prior information, perform soft demodulation on the data to obtain second soft information, and perform hard decision FEC decoding on the second soft information to obtain second coded data, the demodulator 1003 is specifically configured to use the LLR information and the second coded data as prior information, and demodulate the data to obtain second original data, and the demodulator 1003 is specifically configured to determine data obtained by combining the second coded data and the second original data, as the second data.

The processor 1002 is further configured to combine the first data and the second data to obtain to-be-processed data.

This embodiment provides a receiving device, which receives data; obtains modulation information; then performs soft demodulation on the data according to the modulation information to obtain first soft information, and performs soft decision forward error correction FEC decoding on the first soft information to obtain first data and log-likelihood ratio LLR information; obtains second data according to the modulation information, the LLR information, and the data; and finally combines the first data and the second data to obtain to-be-processed data. Because during modulation by a transmit side, soft decision FEC coding is performed only on data of a fixed bit in a symbol, when the received data is demodulated, the data is demodulated by using only a soft decision FEC decoding method corresponding to the soft decision FEC coding method, thereby improving system flexibility.

Figure 11:
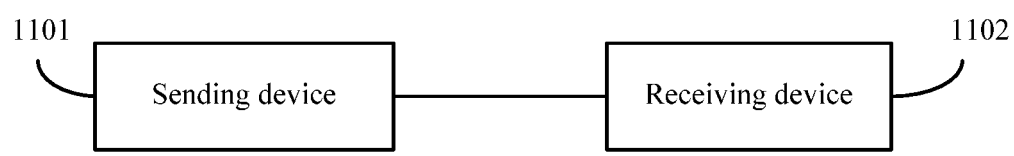
FIG. 11 is a schematic structural diagram of an adaptive modulation and coding system according to an embodiment.

As shown in FIG. 11, FIG. 11 shows an adaptive modulation and coding system according to an embodiment of the present invention. Referring to FIG. 11, the adaptive modulation and coding system includes a sending device 1101 and a receiving device 1102, where the sending device 1101 is the sending device described in the foregoing embodiment; and the receiving device 1102 is the receiving device described in the foregoing embodiment.

This embodiment provides a sending device. The sending device obtains to-be-processed data; then obtains channel information corresponding to the to-be-processed data, and determines a modulation mode according to the channel information; further determines first data and second data from the to-be-processed data according to the modulation mode; performs soft decision forward error correction FEC coding on the first data to obtain a first bit stream; obtains a second bit stream according to the second data; and finally modulates the first bit stream and the second bit stream according to a constellation mapping rule, and sends modulated data; and a receiving device performs partition demodulation on the received data. In this way, switching between different modulation modes can be implemented by performing a soft decision FEC code on the first data of a fixed length by using only one determined code length, and switching complexity is reduced. Moreover, when a higher-performance FEC needs to be used or a modulation mode needs to be added for system upgrade, not all FEC codes need to be re-designed, which improves system upgrade flexibility.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments may be integrated into one processing unit, or each of the units may exist alone physically, or two or more units are integrated into one unit. The integrated unit may be implemented in a form of hardware, or may be implemented in a form of hardware in addition to a software functional unit.

When the foregoing integrated unit is implemented in a form of a software functional unit, the integrated unit may be stored in a computer-readable storage medium. The software functional unit is stored in a storage medium and includes several instructions for instructing a computer device (which may be a personal computer, a server, or a network device) to perform some of the steps of the methods described in the embodiments of the present invention. The foregoing storage medium includes: any medium that can store program code, such as a USB flash drive, a removable hard disk, a read-only memory (ROM for short), a random access memory (RAM for short), a magnetic disk, or an optical disc.

Finally, it should be noted that the foregoing embodiments are merely intended for describing the technical solutions of the present invention but not for limiting the present invention. Although the present invention is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of the present invention.

What is claimed is:

1. A method, comprising:
   obtaining, by a first device, to-be-processed data;
   obtaining, by the first device, channel information corresponding to a channel for sending the to-be-processed data to a second device, wherein the channel information comprises a quality of the channel;
   determining, by the first device, a modulation mode for processing the to-be-processed data, wherein the modulation mode is determined according to the quality of the channel and a transmission distance to the second device;
   determining, by the first device, a first data and a second data from the to-be-processed data according to a modulation order corresponding to the modulation mode;
   generating, by the first device, a first bit stream from the first data, wherein the first bit stream comprises first data encoded using a soft decision forward error correction (FEC) coding scheme;
   generating, by the first device, a second bit stream comprising the second data;
   modulating, by the first device, the first bit stream and the second bit stream using a constellation mapping rule, wherein the constellation mapping rule is determined according to the modulation mode; and sending, using the channel, the modulated first bit stream and the modulated second bit stream to the second device.

2. The method according to claim 1, wherein determining the first data and the second data comprises:
   determining, according to the modulation order, a quantity of bits represented by a modulation symbol;
   dividing a plurality of bits comprised in the to-be-processed data into at least one group of bits, wherein a size of each group of bits is the quantity of bits represented by the modulation symbol;
   determining a first portion from each group in the at least one group of bits as the first data, wherein a first size of the first portion is unchanged for all supported modulation modes; and
   determining a remaining portion from each group in the at least one group of bits as the second data, wherein a sum of the first size of the first portion and of a second size of the remaining portion is equal to the quantity of bits represented by the modulation symbol.

3. The method according to claim 1, wherein generating the second bit stream comprises:
   determining whether to partition the second data based on the modulation order corresponding to the modulation mode;
   in response to determining that the second data is not to be partitioned, generating the second bit stream from the second data, wherein the second bit stream comprises second data encoded using a hard decision FEC coding scheme; and
   in response to determining that the second data is to be partitioned;
      determining a first portion of the second data as a first data partition and a remaining portion of the second data as a second data partition; and
      generating the second bit stream by combining the second data partition and data that is obtained after encoding the first data partition using the hard decision FEC coding scheme.

4. The method according to claim 3, wherein the second data is not to be partitioned and the constellation mapping rule comprises a first Ungerboeck Partitioning (UP) mapping that is used between the first bit stream and the second bit stream; or
   wherein the second data is to be partitioned and the constellation mapping rule comprises a Gray mapping that is used between the second data partition, and a second UP mapping being used between the first bit stream, the data obtained after the hard decision FEC coding scheme is performed on the first data partition, and the second data, partition.

5. The method according to claim 3, wherein the hard decision FEC coding scheme comprises a Bose Ray-Chaudhuri Hocquenghem code or a Reed-Solomon code.

6. The method according to claim 1, further comprising:
   sending, by the first device, modulation information to the second device, wherein the modulation information comprises information related to the modulation mode.

7. The method according to claim 1, wherein the soft decision FEC coding scheme comprises: a low-density parity-check code (LDPC), a convolutional LDPC code, or a polar code.

8. A method, comprising:
   receiving, by a first device, data from a second device;
   obtaining, by the first device, modulation information, wherein the modulation information indicates a modulation mode of the received data and a partition information corresponding to the modulation mode;
   performing soft demodulation on the received data, according to the modulation mode and to the partition information, to obtain first soft information;
   decoding the first soft information using a soft decision forward error correction (FEC) decoding scheme to obtain first data and log-likelihood ratio (LLR) information;
   obtaining second data from the received data, according to the modulation mode, the partition information, and the LLR information; and
   combining the first data and the second data, according to the partition information, to obtain to-be-processed data.

9. The method according to claim 8, wherein obtaining the second data comprises:
   determining, according to partition information, whether to perform partition decoding on the received data;
   in response to determining that the partition decoding is not to be performed on the received data, using the LLR information as prior information:
      performing soft demodulation on the received data to obtain second soft information; and
      performing hard decision FEC decoding on the second soft information to obtain the second data; and
   in response to determining that the partition decoding is to be performed on the received data;
      using the LLR information as prior information, performing soft demodulation on the received data to obtain second soft information, and performing hard decision FEC decoding on the second soft information to obtain a first partition data;
      using the LLR information and the first partition data as prior information, demodulating the received data to obtain second partition data; and
      combining the first partition data and the second partition data to obtain the second data.

10. The method according to claim 8, wherein obtaining the modulation information comprises:
    receiving the modulation information from the second device; or
    obtaining channel information corresponding to a channel used to receive the received data, wherein the channel information comprises a quality of the channel, and determining the modulation information according to the quality of the channel and a transmission distance to the second device.

11. A device, comprising:
    a transmitter;
    a modulator;
    a processor; and
    a non-transitory computer-readable storage medium storing a program to be executed by the processor, the program including instructions for:
       obtaining to-be-processed data;
       obtaining channel information corresponding to a channel for sending the to-be-processed data to a second device, wherein the channel information comprises a quality of the channel;
       determining a modulation mode for processing the to-be-processed data, according to the quality of the channel and to a transmission distance to the second device;
       determining a first data and a second data from the to-be-processed data according to a modulation order corresponding to the modulation mode;

generating a first bit stream from the first data, wherein the first bit stream comprises first data encoded using a soft decision forward error correction (FEC) coding scheme;
generating a second bit stream comprising the second data;
modulating, by the modulator, the first bit stream and the second bit stream using a constellation mapping rule, wherein the constellation mapping rule is determined according to the modulation mode; and
sending, by the transmitter, the modulated-first bit stream and the modulated second bit stream.

12. The device according to claim 11, wherein the program further includes instructions for:
determining, according to the modulation order, a quantity of bits represented by a modulation symbol;
dividing a plurality of bits comprised by the to-be-processed data into at least one group of bits, wherein a size of each group of bits is the quantity of bits represented by the modulation symbol;
determining a first portion from each group in the at least one group of bits as the first data, wherein a first size of the first portion is unchanged for all supported modulation modes; and
determine a remaining portion from each group in the at least one group of bits as the second data, wherein a sum of a first size of the first portion and of a second size of the remaining portion adds up to the quantity of bits represented by the modulation symbol.

13. The device according to claim 11, wherein the program further includes instructions for:
determining whether to partition the second data based on the modulation order corresponding to the modulation mode;
in response to determining that the second data is not to be partitioned, generating the second bit stream from the second data, wherein the second bit stream comprises second data encoded using a hard decision FEC coding scheme; and
in response to determining that the second data is to be partitioned;
determining a first portion of the second data as a first data partition and a remaining portion of the second data as a second data partition; and
generating the second bit stream by combining the second data partition and data that is obtained after encoding the first data partition using the hard decision FEC coding scheme.

14. The device according to claim 13, wherein the hard decision FEC coding scheme comprises a Bose Ray-Chaudhuri Hocquenghem code or a Reed-Solomon code.

15. The device according to claim 13, wherein the second data is not to be partitioned, and the constellation mapping rule comprises a first Ungerboeck Partitioning (UP) mapping that is used between the first bit stream and the second bit stream; or
wherein the second data is to be partitioned, and the constellation mapping rule comprises a Gray mapping that is used between the second data partition, and a second UP mapping that is used between the first bit stream, the data obtained after the hard decision FEC coding scheme is performed on the first data partition, and the second data, partition.

16. The device according to claim 11, wherein the program further includes instructions for:
sending, by the transmitter, modulation information, wherein the modulation information comprises information related to the modulation mode.

17. The device according to claim 11, wherein the soft decision FEC coding scheme comprises: a low-density parity-check code (LDPC), a convolutional LDPC code, or a polar code.

18. A device, comprising:
a receiver, configured to receive data;
a processor, configured to obtain modulation information, wherein the modulation information indicates a modulation mode of the received data and a partition information corresponding to the modulation mode; and
a demodulator, configured to:
perform soft demodulation on the received data, according to the modulation mode and to the partition information, to obtain first soft information;
perform soft decision forward error correction (FEC) decoding on the first soft information to obtain first data and log-likelihood ratio (LLR) information;
obtain second data from the received data, according to the modulation mode, the partition information, and the LLR information; and
combine the first data and the second data, according to the partition information, to obtain to-be-processed data.

19. The device according to claim 18, wherein the demodulator is further configured to:
determine, according to partition information, whether to perform partition decoding on the received data;
in response to determining that the partition decoding is not to be performed on the received data, use the LLR information as prior information to:
perform soft demodulation on the received data to obtain second soft information; and
perform hard decision FEC decoding on the second soft information to obtain the second data; and
in response to determining that the partition decoding is to be performed on the received data:
use the LLR information as prior information to:
perform soft demodulation on the received data to obtain second soft information; and
perform hard decision FEC decoding on the second soft information to obtain a first partition data;
use the LLR information and the first partition data as prior information to demodulate the received data to obtain second partition data; and
combine the first partition data and the second partition data to obtain the second data.

20. The device according to claim 18, wherein the processor is further configured to:
receive the modulation information; or
obtain channel information corresponding to a channel used to receive the received data, wherein the channel information comprises a quality of the channel, and determine the modulation information according to the quality of the channel and a transmission distance.

* * * * *